(12) United States Patent
Gizdarski

(10) Patent No.: US 11,789,077 B2
(45) Date of Patent: Oct. 17, 2023

(54) SINGLE-PASS DIAGNOSIS FOR MULTIPLE CHAIN DEFECTS

(71) Applicant: Synopsys, Inc., Mountain View, CA (US)

(72) Inventor: Emil Gizdarski, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 93 days.

(21) Appl. No.: 17/438,521

(22) PCT Filed: Mar. 13, 2020

(86) PCT No.: PCT/US2020/022758
§ 371 (c)(1),
(2) Date: Sep. 13, 2021

(87) PCT Pub. No.: WO2020/186214
PCT Pub. Date: Sep. 17, 2020

(65) Prior Publication Data
US 2022/0128628 A1  Apr. 28, 2022

Related U.S. Application Data

(60) Provisional application No. 62/817,596, filed on Mar. 13, 2019.

(51) Int. Cl.
*G01R 31/3185* (2006.01)
*G01R 31/3183* (2006.01)

(52) U.S. Cl.
CPC ........ *G01R 31/318544* (2013.01); *G01R 31/318335* (2013.01); *G01R 31/318357* (2013.01); *G01R 31/318569* (2013.01)

(58) Field of Classification Search
CPC .... G01R 31/318544; G01R 31/318335; G01R 31/318357; G01R 31/318569
See application file for complete search history.

(56) References Cited

U.S. PATENT DOCUMENTS 7,240,261 B2 * 7/2007 Huisman ........ G01R 31/318566
716/106
10,215,803 B1 * 2/2019 Remersaro ..... G01R 31/318547
(Continued)

OTHER PUBLICATIONS

J. Ye et al., "Diagnosis and Layout Aware (DLA) scan chain stitching," 2013 IEEE International Test Conference (ITC), Anaheim, CA, USA, 2013, pp. 1-10. (Year: 2013).*

(Continued)

*Primary Examiner* — Cynthia Britt
(74) *Attorney, Agent, or Firm* — Lowenstein Sandler LLP

(57) ABSTRACT

Disclosed herein are method, system, and storage-medium embodiments for single-pass diagnosis of multiple chain defects in circuit-design testing. Embodiments include processor(s) to select a plurality of a scan chains in a circuit under test and determine presence of at least a first defect in the first scan chain, and a second defect in the first scan chain or in the second scan chain. The plurality of scan chains may include specific scan chains that each have respective pluralities of scan cells. Processor(s) may map the first defect to a first range of first scan cells, and the second defect to a second range of second scan cells. Based at least in part on a failing capture-pattern set, processor(s) may locate the first defect in a first scan cell of the first range, and the second defect in a second scan cell of the first range or the second range.

20 Claims, 13 Drawing Sheets

(56) References Cited

U.S. PATENT DOCUMENTS

| | | |
|---|---|---|
| 2006/0111873 A1 | 5/2006 | Huang et al. |
| 2007/0220381 A1 | 9/2007 | Huang et al. |
| 2011/0191643 A1* | 8/2011 | Guo ............... G01R 31/318583 |
| | | 714/E11.026 |
| 2015/0113344 A1* | 4/2015 | Morton .......... G01R 31/318558 |
| | | 714/727 |

OTHER PUBLICATIONS

International Search Report and Written Opinion from International Application No. PCT/US2020/022758 dated Aug. 6, 2020—18 pages.

* cited by examiner

| | 0 | 1 | 2 | 3 | 4 | 5 | 6 | 7 | 8 | 9 | 10 | 11 | 12 | 13 | |
|---|---|---|---|---|---|---|---|---|---|---|---|---|---|---|---|
| FAULTY COMPRESSED TEST RESPONSE | 0 | 0 | ~0 | 1 | 0 | ~1 | 1 | 1 | X | 0 | ~0 | ~0 | ~1 | 0 | F |
| TESTER FAILURES | 0 | 0 | 1 | 0 | 0 | 1 | 0 | 0 | 1 | 0 | 1 | 1 | 1 | 0 | |
| HARD SIMULATON FAILURES | 0 | 0 | 0 | 0 | 0 | 1 | 0 | 0 | 0 | 0 | 0 | 1 | 1 | 0 | H |
| SOFT SIMULATON FAILURES | 0 | 0 | 0 | 0 | 0 | 0 | 0 | 0 | 1 | 0 | 1 | 0 | 0 | 0 | S |
| HARD SIMULATON FAILURES | 0 | 0 | 0 | 0 | 0 | 0 | 0 | 0 | 1 | 0 | 1 | 0 | 0 | 0 | H* |
| SOFT SIMULATON FAILURES | 0 | 0 | 0 | 0 | 0 | 0 | 0 | 0 | 0 | 0 | 1 | 0 | 0 | 0 | S* |

FIG. 5

SINGLE-PASS DIAGNOSIS FOR MULTIPLE CHAIN DEFECTS

CROSS-REFERENCE TO RELATED APPLICATIONS

This application is a national phase entry of International Application No. PCT/US2020/022758, filed Mar. 13, 2020, which claims the benefit of U.S. provisional patent application 62/817,596, filed Mar. 13, 2019, each of which is incorporated by reference herein in their entirety.

COPYRIGHT NOTICE

The assignee of this patent document has no objection to the facsimile reproduction by anyone of the patent document itself, or of the patent application, as it appears in the files of the United States Patent and Trademark Office, but otherwise reserves all rights whatsoever in any included works of authorship protected by copyright.

SPECIFICATION—DISCLAIMERS

In the following Background, Summary, and Detailed Description, headings should not be construed as necessarily limiting. In the following Background, Summary and Detailed Description, the citation or identification of any publication does not signify relevance or status as prior art for any of the claimed or described embodiments. Paragraphs for which the text is all italicized signifies text that is common to multiple Synopsys patent specifications.

BACKGROUND

Conventional chain diagnosis algorithms include any of at least the following disadvantages: 1) failing capture patterns may end up being simulated multiple times because a failing capture pattern can be selected for multiple defective chain and used in multiple passes; 2) calculation of external simulation failures for each fault candidate includes calculation of faulty compressed test response that is a time-consuming operation is a compression mode; and 3) determination of failing capture patterns that increase diagnostic resolution for a defective chain may be difficult in a case of multiple chain defects. For example, failing capture patterns where a defective chain is selected for observation may require increased diagnostic resolution for this scan chain. However, some failing capture patterns where zero or multiple defective chains may be selected for observation may increase diagnostic resolution unnecessarily, to the detriment of accuracy and observability of defects in circuits with multiple defective scan chains.

DRAWINGS

The following Detailed Description, Figures, appended Additional Figures and appended Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale and are part of the Disclosure.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

FIG. 5 depicts an erroneous signature and faulty compressed test response, according to some embodiments.

Figure 10:
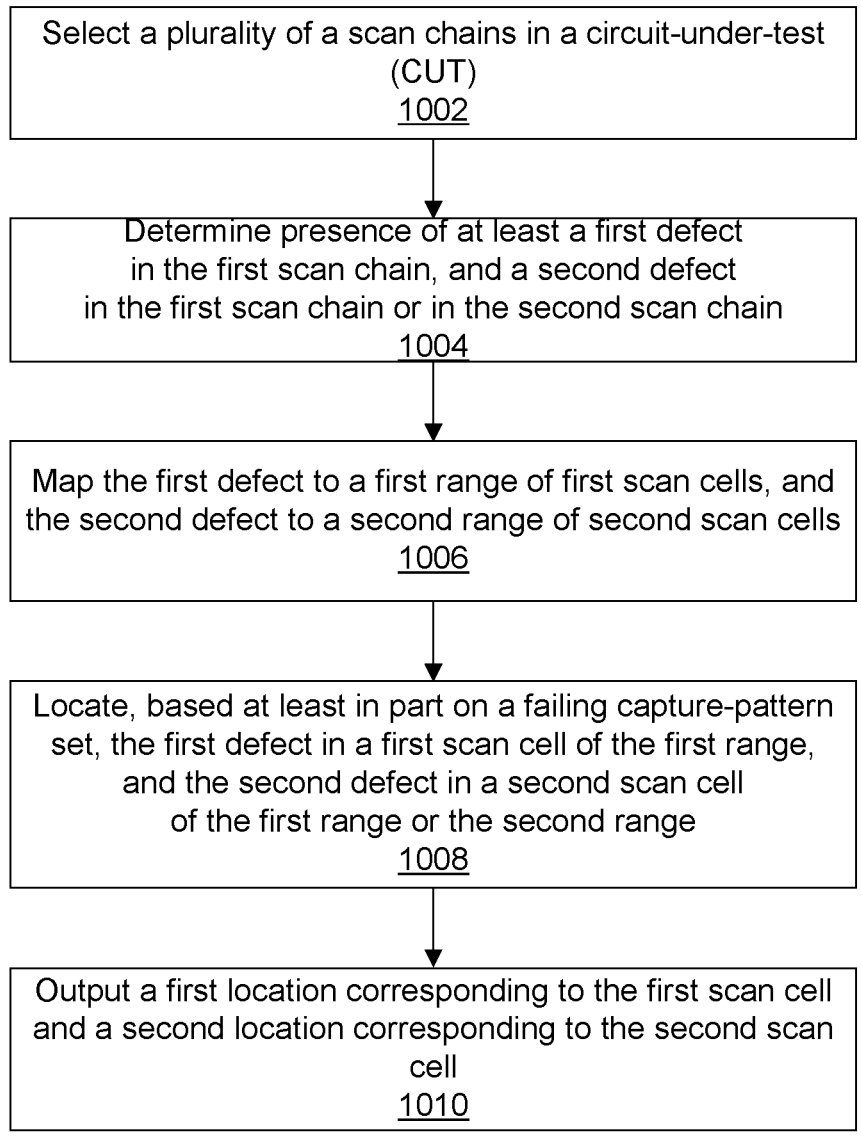

FIG. 10. depicts a flowchart showing an example method for single-pass diagnosis of multiple chain defects, according to some embodiments.

Figure 11:
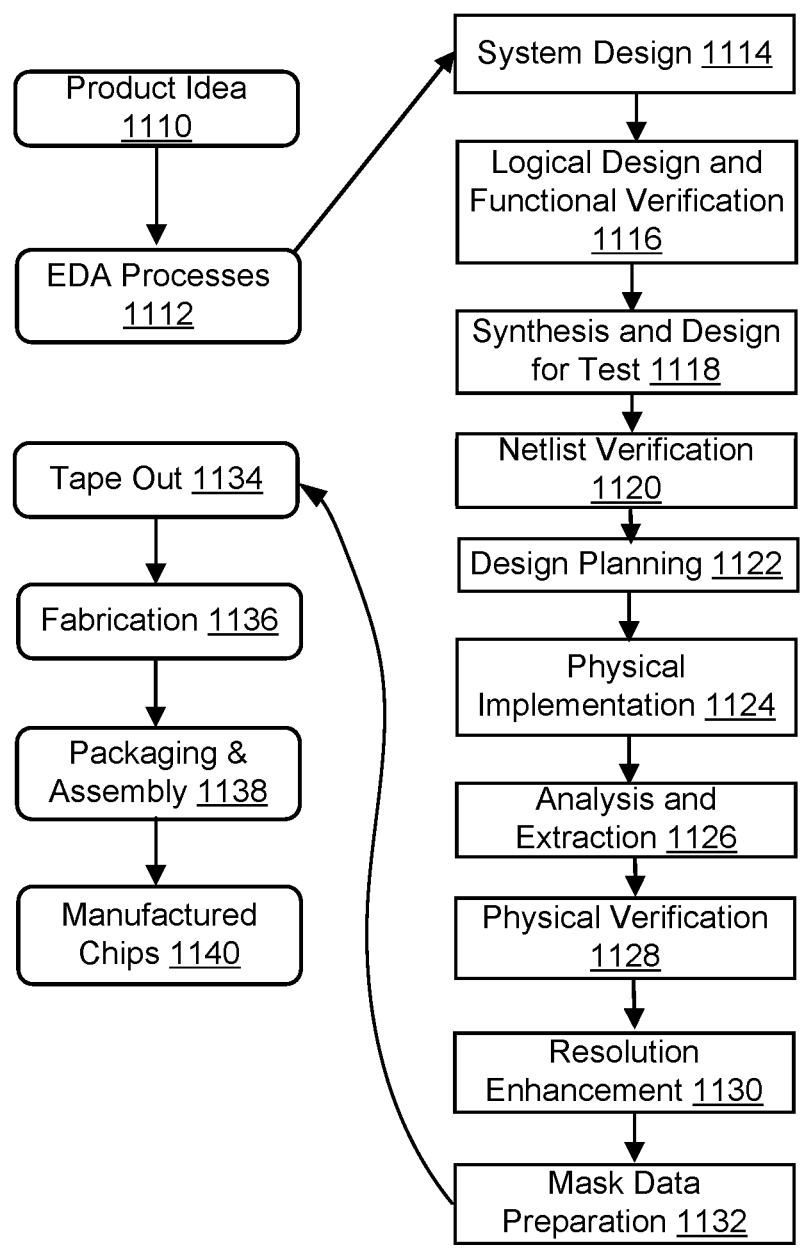

FIG. 11 depicts a flowchart of various operations in the design and fabrication of an integrated circuit in accordance with an embodiment of the present disclosure.

Figure 12:
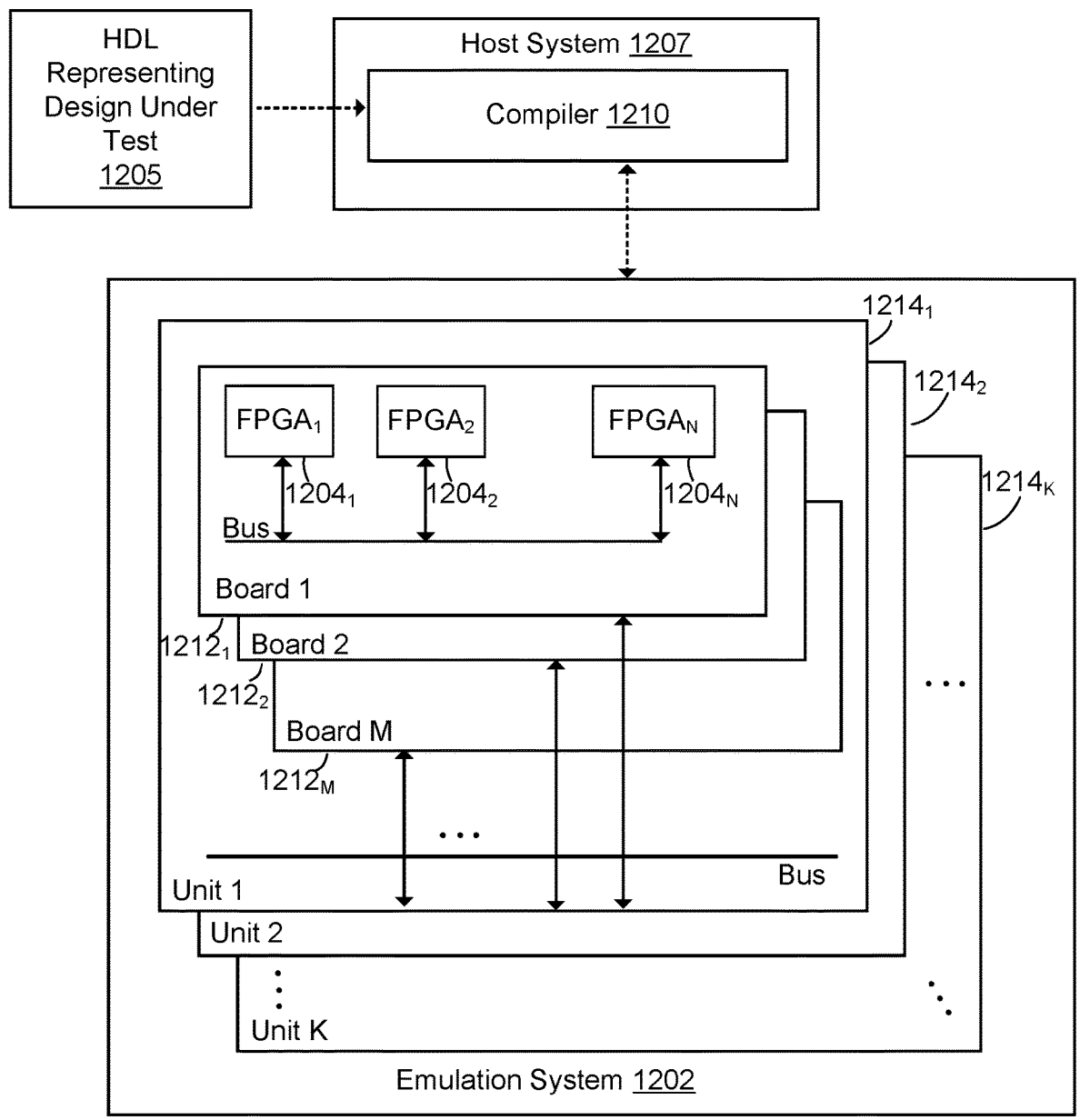

FIG. 12 depicts a diagram of an example emulation system in accordance with some embodiments of the present disclosure.

Figure 13:
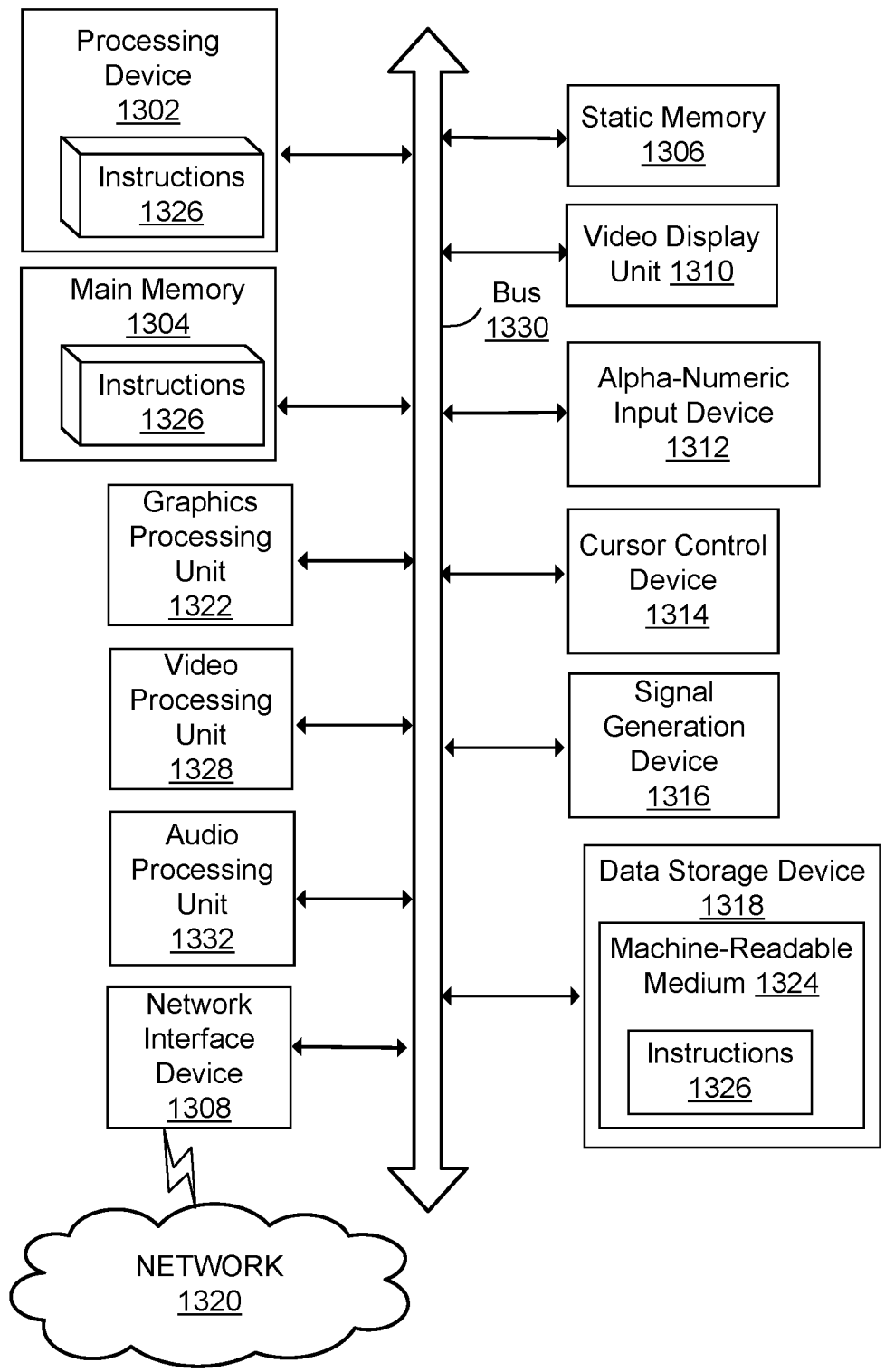

FIG. 13 depicts a diagram of an example computer system in which embodiments of the present disclosure may operate.

In such various figures, reference signs may be omitted as is consistent with accepted engineering practice; however, one of ordinary skill in the art will understand that the illustrated components are readily understood when viewed in context of the illustration as a whole and the accompanying disclosure describing such various figures.

DETAILED DESCRIPTION

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

Electronic design automation (EDA) may be applied in the semiconductor industry for virtually any circuit-design project. After a product is developed, EDA tools may be used to define a specific implementation, including lithographic masks for production of the finished chips, in a process that may be referred to as tape-out. The lithographic masks may then be used with fabrication equipment to manufacture integrated-circuit wafers. Testing and diagnosis may be used to determine defective dies and locations of any defects, which may be referred to as defect localization.

Volume diagnosis may quickly provide sufficient amount of data for identification of systematic defects. Electrical failure analysis and physical failure analysis (PFA) may be used for reducing a physical area and for gathering information about specific defects. As a result, root causes of the systematic defects may be identified and used for correction of masks, and/or implementation of design- and fabrication-process improvements that may increase yield. Finally, the wafers may be diced, packaged, and assembled to provide integrated-circuit chips for distribution.

An example procedure for using EDA tools begins with a design specification of a product to be implemented using the integrated circuit. Logic-design tools may be applied to create a high-level description based on description languages such as Verilog or VHDL, and functional verification tools may be applied in an iterative process to assure that the high-level description accomplishes the design specification. Synthesis and design-for-test tools may be used to translate the high-level description to a netlist, customize the netlist for target technology, and insert test logic that permits testing of the finished chips.

A typical design flow might next include a design planning stage, in which an overall floor plan for the chip may be constructed and analyzed to ensure that timing parameters for the netlist can be achieved at a high level. Next, the netlist may be rigorously checked for compliance with timing constraints and with functional definitions defined at a high level using VHDL or Verilog. After an iterative process to settle on a netlist and map the netlist to a cell library for the final design, a physical implementation tool may be used for placement and routing. A tool performing placement positions circuit elements on the layout, and a tool performing routing defines interconnects for the circuit elements.

The components defined after placement and routing may then be analyzed at the transistor level using an extraction tool and verified to ensure that the circuit function may be achieved, and timing constraints may be met. The placement and routing process can be revisited as needed in an iterative fashion. Next, the design may be subjected to physical verification procedures, such as design-rule checking (DRC), layout-rule checking (LRC) and layout-versus-schematic (LVS) checking, that analyze manufacturability, electrical performance, lithographic parameters, and circuit correctness.

After closure on an acceptable design by iteration through design and verification procedures, such as those described above, the resulting design may be subjected to resolution enhancement techniques that may provide geometric manipulations of the layout to improve manufacturability. Mask data may be prepared and taped out for use in producing finished products.

This design process with EDA tools may include circuitry for testing a finished product, e.g., as a testbench circuit for testing other circuits. Efficient testing of integrated circuits may use structured design-for-testability (DFT) techniques. In particular, these techniques may provide for control and/or observation of all or some memory elements, e.g., flip-flops, latches, etc., in the circuit under test (CUT). An example DFT methodology may be based on scan chains. This approach assumes that during testing, memory elements may be included in logical or physical electronic structures that may function as shift registers. Such logical or physical electronic structures may be referred to as scan chains. As a result, the designed logic circuit has two (or more) modes of operation, including at least a functional mode and a test mode. In the functional mode, the memory elements may perform their regular functions. In the test mode, the memory elements may become scan cells that are connected to form one or more scan chains. These scan chains are used to scan-in test stimuli into a CUT and scan-out test responses. Applying a test pattern may include performing scan-in (or loading) of a test stimulus, applying one or more capture clocks, and performing scan-out (unloading) of the captured test response, for example. Additionally, in some embodiments, the test responses may be compared to fault-free test responses to determine whether the CUT works properly.

Figure 1:
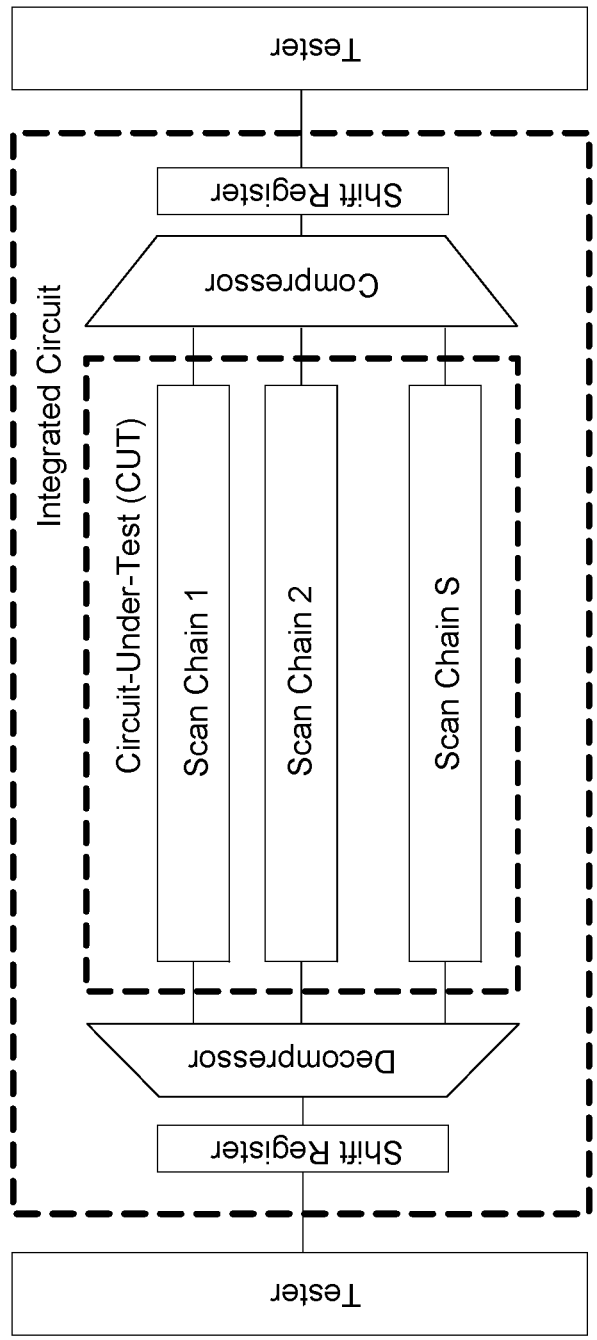
FIG. 1 depicts an example block diagram of an integrated circuit having on-chip test data compression capability, according to some embodiments.

An approach for reducing test pins, test data volume, and test application time may be to use compressed test stimuli and a compressed test response rather than loading all test stimuli and unloading the entire test response, respectively. A block diagram of an integrated circuit having an on-chip test data compression capability is shown in FIG. 1. Accordingly, a tester may be coupled to an integrated circuit comprising a CUT, a decompressor, and a compressor via shift registers or shift-register functionality.

Still referring to FIG. 1, volume diagnosis for yield learning may reduce actual time needed to meet an aggressive schedule for yield ramping before volume production, for example. Given tester failures for a test pattern set along with design information, a diagnosis tool may identify fault candidates that may serve to isolate the corresponding location(s) these failures. A diagnostic callout for a single device, when mapped to multiple defect locations and defect mechanisms, may thus have some ambiguity as a result of multiple defects being potentially masking each other or otherwise being uncertain with respect to the single device. This ambiguity may be mitigated or eliminated by volume diagnosis, statistical analysis, and PFA, that may determine a set of common physical defect features or root causes.

Yield may be improved by fixing the issues of these root causes. The on-chip test data compression adds complexity in the process because scan chains in the CUT may not be directly observable. The diagnosis uses specialized procedures for defect localization in logic, scan chains, clock trees, and so on, as will be appreciated by those of ordinary skill in the art.

Volume chain diagnosis may be performed in early stages of design manufacturing and yield ramping when multiple chain defects may be likely to exist. An input of chain diagnosis includes a design netlist, test pattern set and tester failures for a defective die. Chain diagnosis may use an effect-cause analysis to calculate a fault-effect of fault candidates based on a fault model wherein the fault model may include at least the following defect types: stuck-at-0, stuck-at-1, slow-to-rise, slow-to-fall, slow-to-rise-and-fall, fast-to-rise, fast-to-fall and fast-to-rise-and-fall. The test pattern set may include chain test patterns and capture patterns. If a chain test pattern fails on the tester, then a shift operation may be affected due to defect in scan chains, clock tree, set-reset tree, or scan-enable tree, for example. Defective chains and defect types may be identified based on chain test patterns without simulation as discussed by K. Stanley, in "High-accuracy Flush-and-Scan Software Diagnostic," IEEE Design Test of Computers, vol. 18, no. 6, pp. 56-62, 2001. For example, the chain test patterns scan-in test sequence "00110011" and scan-out test sequence "00000000" may indicate a presence of stuck-at-0 fault in the corresponding scan chain. Next, an initial range of suspect scan cells may include some or all scan cells in the defective chain. A defect localization may be performed based at least in part on the failing capture patterns—here, capture patterns scan-in test stimuli apply one or more capture clocks and scan-out capture test response. The effect-cause chain diagnosis may use a fault simulation that may inject a fault candidate in the first scan cell of the range (close to the scan-out) and calculates ranking score. A fault simulation may incrementally calculate scores ranking other scan cells in the range. The fault candidates may be pruned based on the ranking scores and fault candidates having low scores may be eliminated for each simulation pass, for example. In some embodiments, the process may continue until all failing capture patterns may be used or the range of suspect scan cells may be reduced to a single scan cell.

Figure 2:
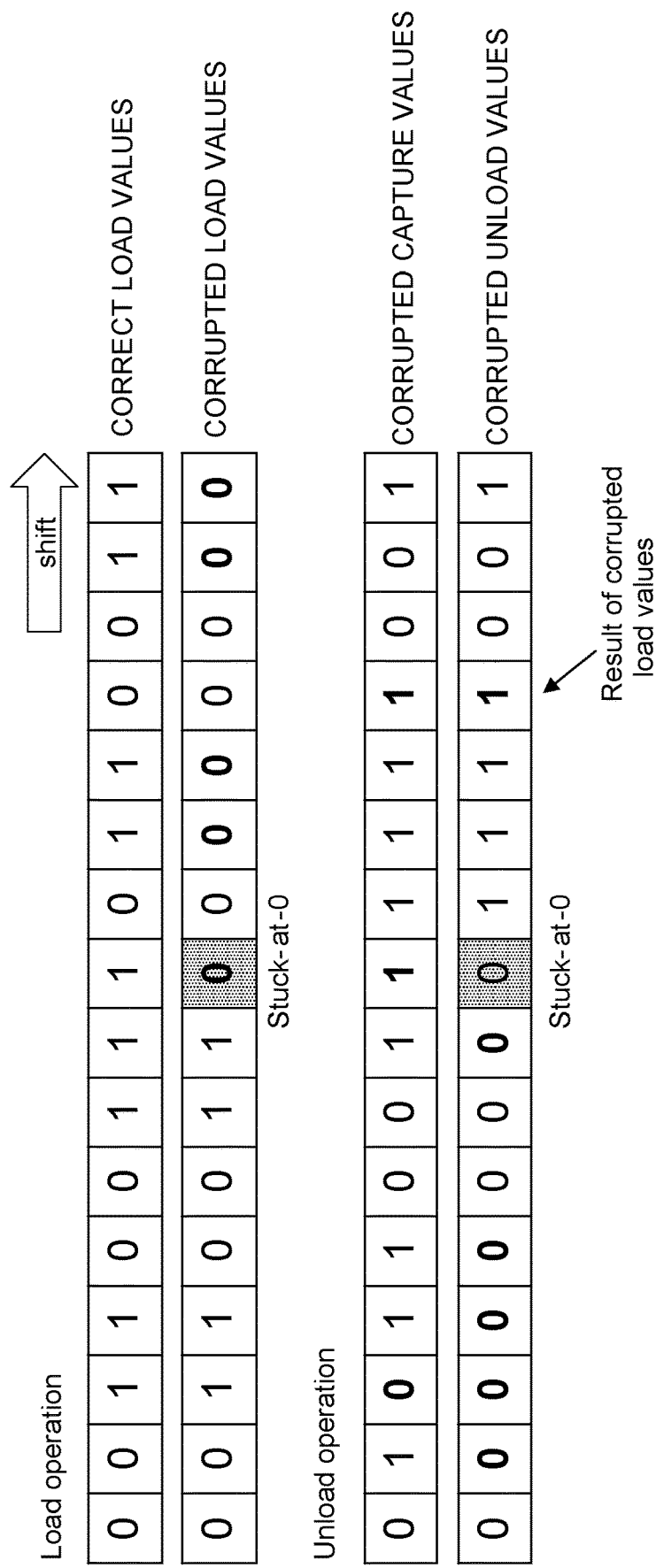
FIG. 2 depicts an example of a faulty test response for an unknown position, according to some embodiments.

For a single chain defect, the fault simulation may calculate fault-effect of the first scan cell in the range based on the following steps: set load values for selected failing capture patterns, modify load values for this scan cell and some or all downstream scan cells, calculate corrupted capture values by a good-machine simulation (e.g., a known correct test, fault-free simulation, etc.), and calculate a faulty test response by modifying unload values for this scan cell and some or all upstream scan cells as showing a stuck-at-0 fault, as shown in FIG. 2. Note that the corrupted load values may be 0 for the defect position and some or all downstream scan cells, and the corrupted unload values may be 0 for defect position and some or all upstream scan cells. Simulation failures may be calculated by comparing expected fault-free test response and faulty test response. Ranking scores may be calculated by comparing simulation failures with the tester failures. The ranking score may include any of at least three components: e.g., the number of predicted, mis-predicted, and non-predicted tester failures. An ideal fault candidate may explain all tester failures, without including any mis-predicted tester failures or any non-predicted tester failures.

Chain diagnosis of multiple chain defects may require fault simulation for a range of suspect scan cells. For each defective chain, the chain diagnosis may select a set of failing capture patterns and calculate ranking score for each fault candidate based on the range of suspect scan cells for other defective chains. First, loaded values of suspect scan cells and their downstream scan cells may be modified. A good machine simulation may be performed to calculate corrupted capture values based on the modified load values. The faulty test response may be calculated by modifying corrupted unload values for suspect scan cells and their upstream scan cells. A fault effect of multiple faults may be calculated based on superposition of fault effects of respective faults. The resultant composite fault have 0, 1, or X when the fault effects of the multiple faults have value 0 only, value 1 only, or different respective values.

Figure 3:
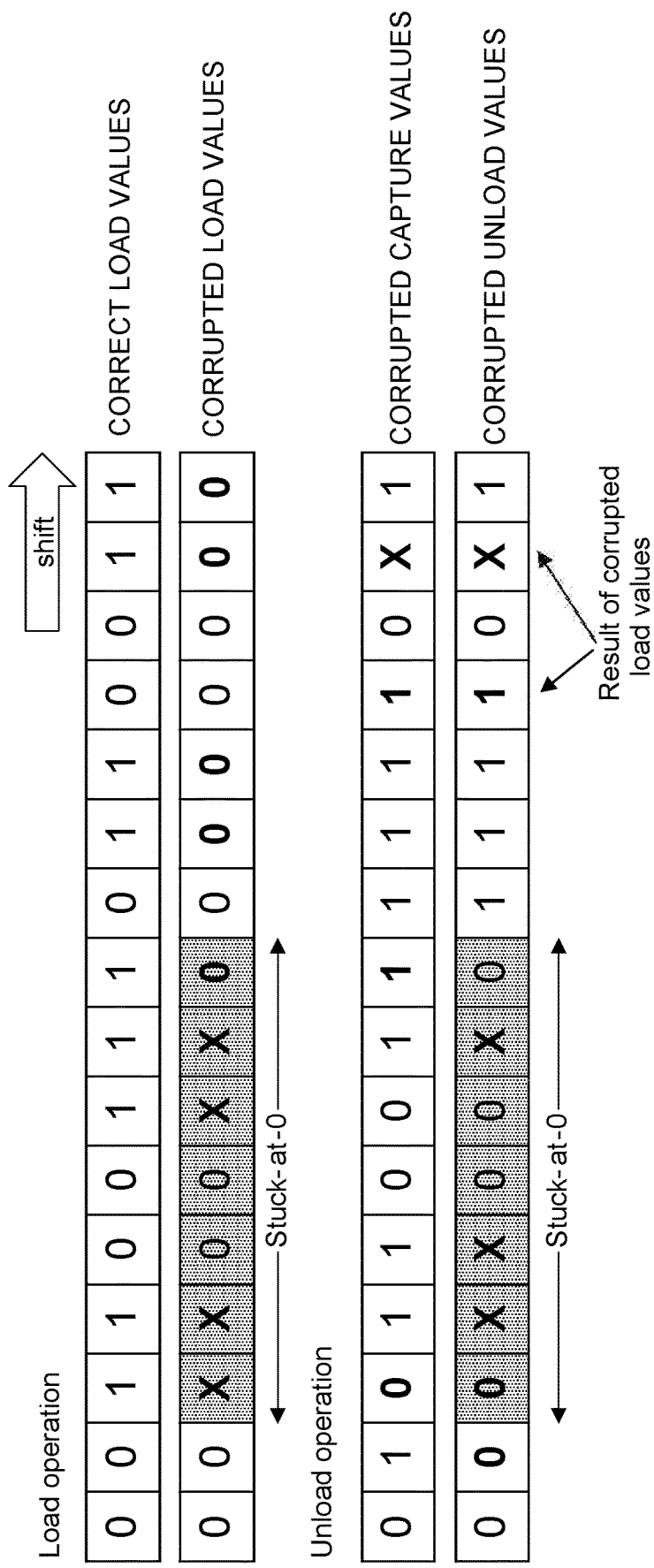
FIG. 3 depicts an example of a faulty test response for an unknown position, according to some embodiments.

FIG. 3 depicts an example calculation of a faulty test response for a range of suspect scan cells under assumption of a single fault per defective chain. The faulty test response may be calculated based on the assumption that one fault candidate exists within this range. Changes with respect to (w.r.t.) fault-free values may be marked in boldface. A defect localization may be performed by ranking fault candidates of the current defective chain wherein the ranking score of each fault candidate may be calculated by comparing simulation failures with tester failures as discussed in R. Guo and S. Venkataraman, "A Technique for Fault Diagnosis of Defects in Scan Chains," Proc. International Test Conference, 2001, pp. 268-277, and discussed in Y. Huang, W.-T. Cheng, R. Guo, "Diagnose Multiple Stuck-at Scan Chain Faults," Proc. IEEE European Test Symposium, 2008, pp. 105-110.

Figure 4:
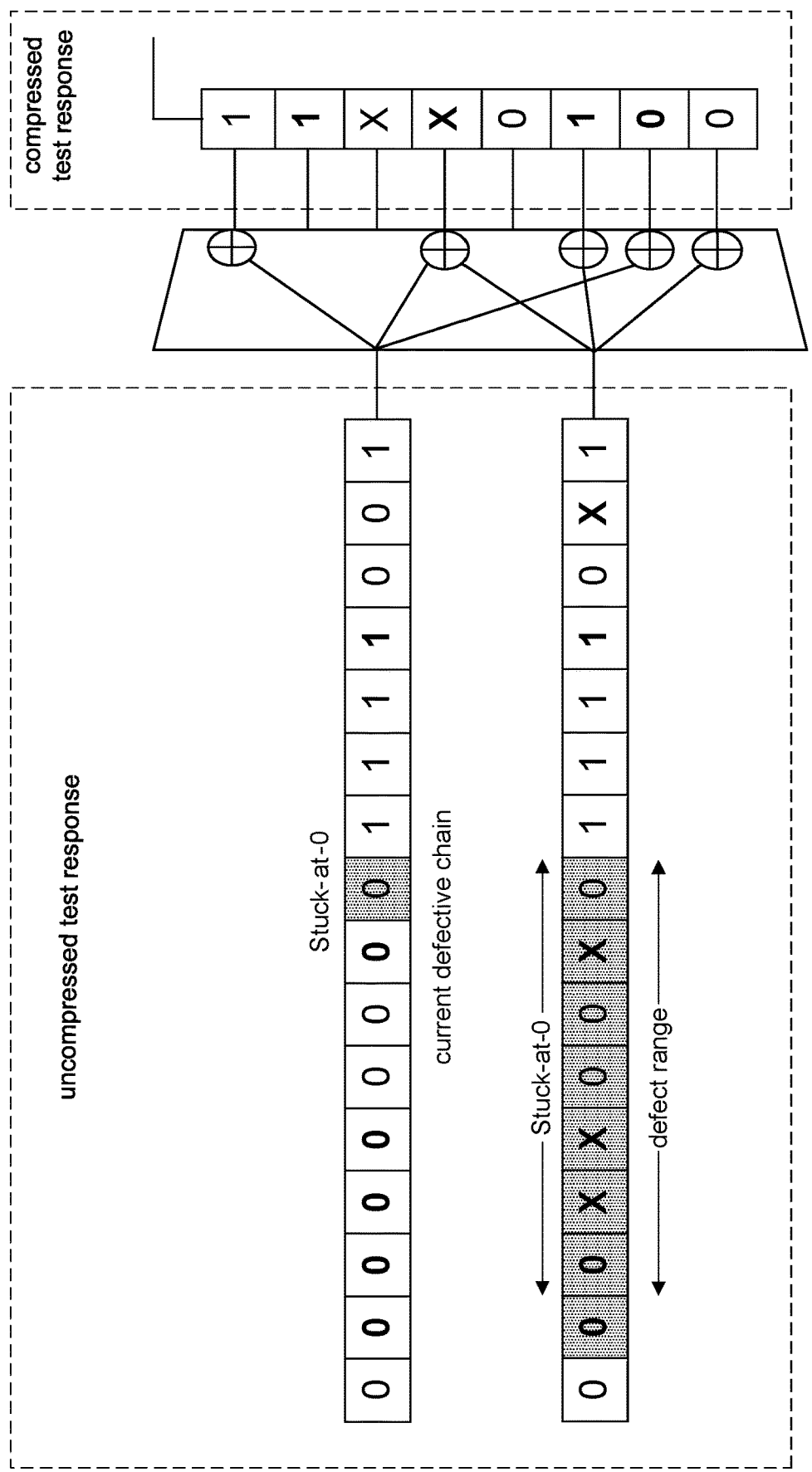
FIG. 4 depicts the fault simulation for multiple chain defects, according to some embodiments.

In compression mode, external simulation failures may be calculated by comparing expected fault-free compressed test response and faulty compressed test response at outputs of a compactor circuit. FIG. 4 depicts fault simulation for multiple chain defects. For a given defective chain, the defect localization may be performed by calculating ranking score for each fault candidate when a range of suspect scan cells may be used for other defective scan chains. A faulty uncompressed test response is shown in the left-hand side of FIG. 4. A faulty compressed test response is shown in the right-hand side of FIG. 4, with changes from fault-free values marked in boldface. A compactor-independent diagnosis as described in W.-T. Cheng, K.-H. Tsai, Y. Huang, N. Tamarapalli, and J. Rajski, "Compactor Independent Direct Diagnosis," Proc. IEEE Asian Test Symp. 2004, pp. 204-209, modifies the circuit under test such that the compactor is included in the simulation model. This approach may be adapted for calculating ranking scores for chain diagnosis in compression mode as further discussed in Y. Huang, W.-T. Cheng, and J. Rajski, "Compressed Pattern Diagnosis for Scan Chain Failures," Proc. IEEE International Test Conference, 2005, pp. 751-759.

Further, in Y. Huang, X. Fan, H. Tang, M. Sharma, W.-T. Cheng, B. Benware, S. M. Reddy, "Distributed Dynamic Partitioning Based Diagnosis of Scan Chain," Proc. IEEE VLSI Test Symposium, 2013, pp. 105-110, a dynamic partition is proposed to increase the throughput of volume diagnosis. Average speed up 1.2-13.2× may be achieved with only minor degradation in accuracy (≤4%) or resolution (≤0.7%). In S. Kundu, K. Kumar, R. Kumar, R. Kapur, "Diagnosing multiple faulty chains with low pin convolution compressor using compressed production test set," Proc. IEEE International Test Conference, 2017, a multiple pass chain diagnosis algorithm is proposed to increase resolution for multiple chain defects. As a result, the range of suspect scan cells of a defective chain may be reduced, which may in turn reduce X's (deterministic representation of multiple defects in one pass) in the faulty compressed test response for next defective chain. A conventional chain-diagnosis algorithm is shown in Listing 1 below:

Listing 1: Chain Diagnosis

```
1:  pass = 0;
2:  Determine defect type and initial range for all defective chains;
3:  while (pass ≤ 1) do {
4:      for (each defective chain) do {
5:          if resolution is good then continue;
6:          Select failing capture patterns for this chain;
7:          for (each simulation pass) do {
8:              Modify load values based on the range for other defective chains;
9:              Perform good machine simulation;
10:             Modify unload values based on the range for other defective chains;
11:             for (each fault candidate in the range) do {
12:                 Modify load values for the current fault candidate;
13:                 Propagate simulation changes;
14:                 Modify unload values for the current fault candidate;
15:                 Calculate faulty compressed test response;
16:                 Compare faulty and fault-free compressed test response;
17:                 Calculate score for this fault candidate;
18:             }
19:             Update range for the current defective chain;
20:         }
21:     }
22:     pass = pass + 1
23: }
```

Single-Pass Chain Diagnosis Algorithm

A single-pass chain diagnosis algorithm that may resolve disadvantages of conventional chain diagnosis is described. The enhanced techniques disclosed herein may increase throughput of volume diagnosis while preserving accuracy and resolution of a diagnostic callout. A failing capture pattern may be simulated at least once, based at least in part on a selection, which may be performed dynamically in response to stimuli during the simulation. The selection may rank failing capture patterns for each simulation pass such that a sum of the ranges of suspect scan cells of defective chains may be reduced after some simulation pass(es). In some embodiments, a selected range may be limited to a given set of determined defect types.

As a result of the simulation, top-ranked capture patterns for each simulation pass may allow observation of a defective chain, increasing the range of the simulation, e.g., in terms of scan chains and scan cells, while reducing overall incidences of other defective chains. Such a single-pass chain diagnosis algorithm may also include steps to calculate a signature of circuit-test values corrupted due to faults (erroneous signatures), based on incremental changes in the faulty uncompressed rest response that may include data for tester failures and simulation failures thereby avoiding computing a compressed test response. An example of such a chain diagnosis algorithm is shown in Listing 2 below.

Listing 2: Enhanced Chain Diagnosis (Single Pass for Multiple Chain Defects)

```
1:  Determine initial range of defective chains;
2:  for (each simulation pass) do {
3:      Select failing capture patterns for defective chains in the range;
4:      Perform good machine simulation;
5:      for (each defective chain) do {
6:          Modify load values for other defective chains;
7:          Propagate simulation changes;
8:          Calculate corrupted unload values for other defective chains;
9:          for (each fault candidate in the range) do {
10:             Modify the load values for the current fault candidate;
11:             Propagate simulation changes;
12:             Calculate corrupted unload values for the current fault candidate;
13:             Calculate erroneous signature;
14:             Calculate ranking score based on the erroneous signature;
15:         }
16:         Update range for the current defective chain;
17:     }
18: }
```

For example, incremental changes in faulty uncompressed test response ($0 \rightarrow 1$ and $1 \rightarrow 0$) and ($0 \rightarrow X$, $X \rightarrow 0$ $X \rightarrow 1$) may be called hard and soft simulation failures, respectively. An erroneous signature, as defined above, may include <F/H/S> vectors for each compressed test response bit where F={0, 1}, H={0,1} and S={0,1} indicates absence and presence of tester failure, hard simulation failure and S soft simulation failures, respectively.

Table 1 depicts how external simulation failures may be indirectly determined based on an erroneous signature. The erroneous signature may provide a more computationally efficient incremental calculation for ranking scores. The erroneous signature, in some embodiments, may be based on incremental changes in the faulty uncompressed rest response, which may avoid a need to calculate a faulty compressed test response.

TABLE 1

Calculating Extremal Failures

| Fault-free Compressed Value | <F, H, S> | | Faulty Compressed Value | Simulation failure |
|---|---|---|---|---|
| X | — | — | — | No |
| 0 | H even | S = 0 | 0 | Pass |
|   | H even | S ≠ 0 | X | 0→X |
|   | H odd  | S = 0 | 1 | 0→1 |
|   | H odd  | S ≠ 0 | X | 0→X |
| 1 | H even | S = 0 | 1 | Pass |
|   | H even | S ≠ 0 | X | 1→X |
|   | H odd  | S = 0 | 0 | 1→0 |
|   | H odd  | S ≠ 0 | X | 1→X |

FIG. 5 shows an example of an erroneous signature and a faulty compressed test response for a given example fault candidate. The faulty compressed test response, according to some example embodiments, may have 14 bits labeled from 0 to 13, for example. In this example embodiment, each bit of the test response may be represented by one of the values of {0, 1, X, ~0, ~1}. where, X signifies an unknown fault-free value (e.g., due to multiple chain defects); 0 refers to a case in which fault-free and faulty values are both 0; 1 refers to a case in which fault-free and faulty values are both 1; ~0 means that the fault-free and faulty values are 0 and 1, respectively; and ~1 means that the fault-free and faulty values are 1 and 0, respectively.

The erroneous signature may include five vectors: F, H, S, H*, and S*, according to some example embodiments. These vectors may correspond to tester failures, hard simulation failures, soft simulation failures, incremental hard simulation failures, and incremental soft simulation failures, respectively. A ranking score calculation of this example fault candidate may include the following steps: vectors H* and S* may be calculated based on incremental changes in the compressed test response; the ranking score may be updated based on vectors H* and S*; vectors H and S may be calculated by superposition of vectors H and S with vectors H* and S*, respectively; and vectors H* and S* may be initialized for next fault candidate. For example, according to some embodiments, these calculations may be represented as H(next)=H⊕H*, S(next)=S⊕S* (accumulate incremental changes) H*=0 and S*=0 (initialize incremental changes).

In the present example, bits 8 and 10 may show two special conditions. For bit 8, vectors F, H, S, H*, and S* have values 1, 0, 1, 1, and 0, respectively. This condition may indicate that the fault candidate may explain the corresponding tester failure if soft simulation failures are ignored, for example. This condition may be treated as a potential predicted tester failure. For bit 10, vectors F, H, S, H*, and S* have values 1, 0, 1, 1, and 1, respectively. This condition may indicate that the current fault candidate may explain the corresponding tester failure (e.g., where F=1 and H(next)=H⊕H*=1) and where the number soft simulation failures is 0 (e.g., S(next)=S⊕S*=0). This condition may be treated as a predicted tester failure because the current fault candidate explains the corresponding tester failure (e.g., F=H(next)=1) and the number of soft failures is 0 (e.g., S(next)=0). In this way, the erroneous signature may include complete information for efficient and accurate computation of ranking scores. As a result, computing the compressed test response may be avoided.

Figure 6:
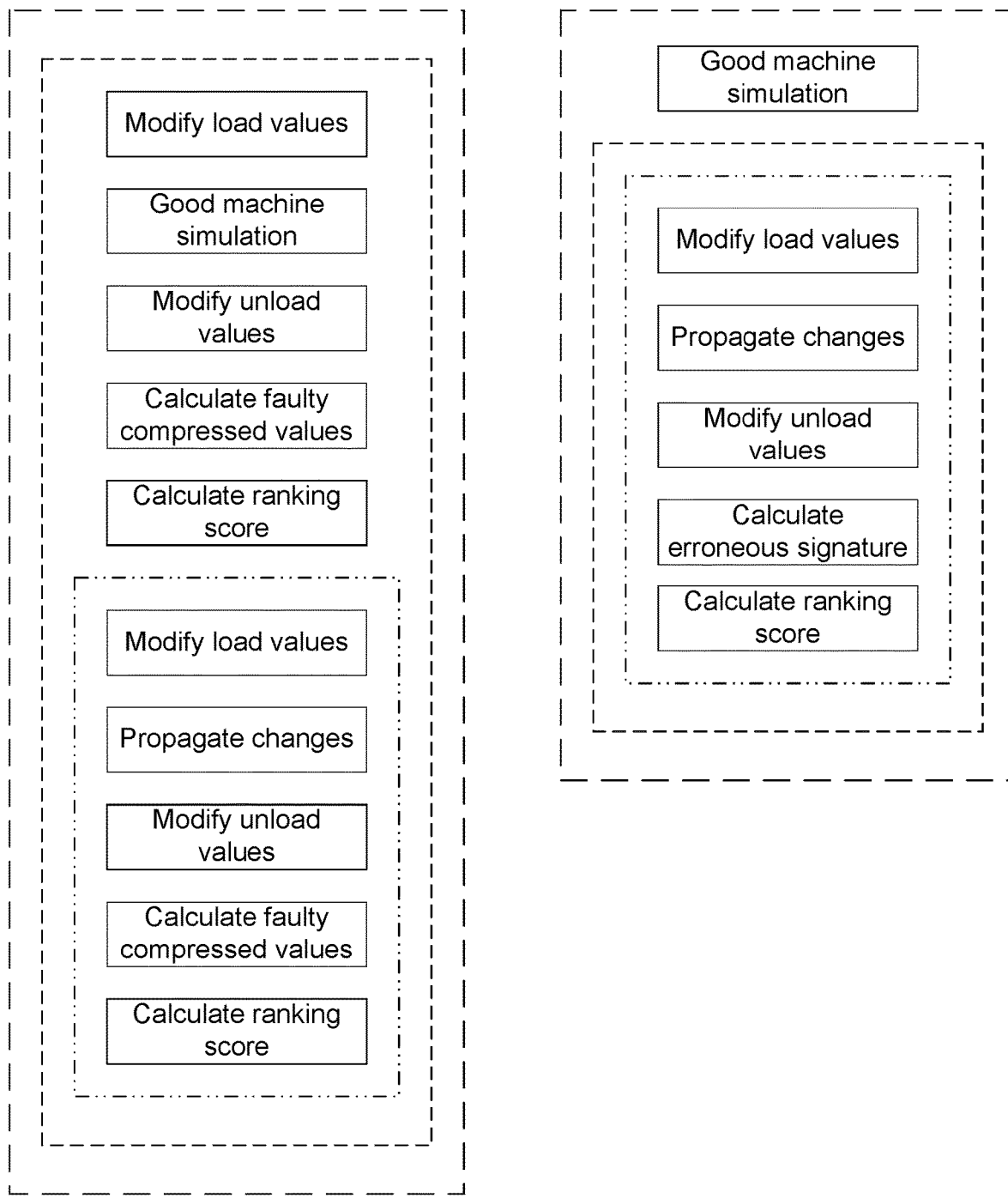
FIG. 6 depicts an example fault-simulation process, according to some embodiments.

FIG. 6 illustrates a fault-simulation process. Some novel distinctions may include the following: a good-machine simulation may be preformed once for all defective chains, whereas a conventional approach performs good-machine simulation for each defective chain; and ranking score calculation may be based on erroneous signature, whereas a conventional approach to calculate ranking scores may depend on a faulty compressed test response. Further features of the proposed algorithm may include the following: computing a fault-free uncompressed test response; computing erroneous signature based on incremental changes in an uncompressed test response; computing ranking scores based on erroneous signature; and selecting failing capture patterns, in some embodiments dynamically, such that overall resolution for all defects may be increased. As a result, computing a faulty compressed test response may be avoided. Additional features and advantages may be realized and appreciated by persons of ordinary skill in the art.

Experimental Validation

Experimental validation of the proposed chain diagnosis algorithm may be performed based on fault injection and tester failures for six designs having one or more codec (compressor-decompressor) such that each codec includes a non-linear decompressor and a finite linear time compactor. Characteristics of all six test designs in this experiment are shown in Table 2. Special patterns may be generated to enable diagnosis for multiple chain defects such that each chain may be directly observable for one chain test pattern and ten capture patterns. The experimental results for fault injection may be shown in Table 3. Up to 10 stuck-at faults may be injected for each experiment. The baseline may be a multi-pass algorithm described in S. Kundu, K. Kumar, R. Kumar, R. Kapur, "Diagnosing multiple faulty chains with low pin convolution compressor using compressed production test set," Proc. IEEE International Test Conference, 2017.

All experimental results may be based on a single thread. Diagnostic callout may be more accurate if correct position in the defective chain is reported. Resolution may measure the quality of the diagnostic callout for PFA based on the number of reported fault candidates. The diagnostic callout may be considered PFA-able (good for PFA), in some embodiments, if at most three consecutive scan cells (positions) of the defective chain may be reported, to illustrate one non-limiting example.

In some experiments, an algorithm such as described above has achieved up to 100% accuracy, while additionally realizing 2.16% improved resolution over a corresponding baseline multi-pass algorithm. Such experiments may demonstrate that the proposed single-pass algorithm consistently improves the quality of diagnostic callout. Still referring to Table 3, the rightmost column shows the speedup for a single-pass algorithm with respect to the baseline multi-pass algorithm. The experimental results show that the single-pass algorithm, in these experiments, may be 20.22 times faster on average than the baseline multi-pass algorithm. This speedup may reflect an increase in the number of simulated patterns per simulation pass using a 64-bit word size instead of a 32-bit word size, which may avoid a need for multiple simulations of failing capture patterns, resulting in more efficient calculation of ranking scores based on the erroneous signature described above herein.

TABLE 2

Design Characteristics

| Designs | #flip-flops | #chains | #codecs | #scan-ins | #scan-outs | #shifts |
|---|---|---|---|---|---|---|
| D1 | 115K | 500 | 1 | 10 | 10 | 231 |
| D2 | 165K | 500 | 1 | 4  | 1  | 549 |

TABLE 2-continued

Design Characteristics

| Designs | #flip-flops | #chains | #codecs | #scan-ins | #scan-outs | #shifts |
|---|---|---|---|---|---|---|
| D3 | 165K | 500 | 1 | 4 | 2 | 275 |
| D4 | 1.81M | 6232 | 11 | 52 | 22 | 291 |
| D5 | 3.49M | 11547 | 19 | 65 | 26 | 335 |
| D6 | 4.71M | 16176 | 13 | 62 | 27 | 291 |

TABLE 3

Experimental Results Based on Fault Injection

| Design | #Injected Faults | #Experiments | #Accurate | | #PFA-able | | Speedup |
| | | | Baseline | Enhanced | Baseline | Enhanced | |
|---|---|---|---|---|---|---|---|
| D1 | 1 | 100 | 100 | 100 | 94 | 94 | 5.02 |
|  | 2 | 100 | 200 | 200 | 192 | 192 | 6.43 |
|  | 3 | 100 | 300 | 300 | 284 | 285 | 6.97 |
|  | 4 | 100 | 400 | 400 | 357 | 366 | 7.70 |
|  | 5 | 100 | 500 | 500 | 450 | 461 | 8.21 |
|  | 6 | 100 | 600 | 600 | 549 | 562 | 9.31 |
|  | 7 | 100 | 700 | 700 | 639 | 647 | 12.94 |
|  | 8 | 100 | 800 | 800 | 744 | 755 | 9.73 |
|  | 9 | 100 | 900 | 900 | 825 | 832 | 11.53 |
|  | 10 | 100 | 1000 | 1000 | 903 | 915 | 12.23 |
| D2 | 1 | 50 | 50 | 50 | 33 | 36 | 16.4 |
|  | 2 | 50 | 99 | 100 | 71 | 73 | 22.99 |
|  | 5 | 50 | 247 | 250 | 136 | 151 | 37.35 |
|  | 10 | 50 | 494 | 500 | 259 | 264 | 59.38 |
| D3 | 1 | 50 | 50 | 50 | 34 | 36 | 12.38 |
|  | 2 | 50 | 100 | 100 | 76 | 76 | 20.81 |
|  | 5 | 50 | 248 | 250 | 140 | 158 | 40.14 |
|  | 10 | 50 | 498 | 500 | 292 | 306 | 64.39 |
| Total | 5 | 1400 | 7286 | 7300 | 6078 | 6209 | 20.22 (average) |

Next, validation based on tester failures was performed for real designs. This example experiment is based on 82 defective dies with multiple defective chains, up to 32 defective chains in a single die. In summary, the lack of degradation in diagnostic callout with respect to the baseline. By contrast, as an improvement, at least four dies became PFA-able due to higher scores and/or fewer reported fault candidates.

Figure 7:
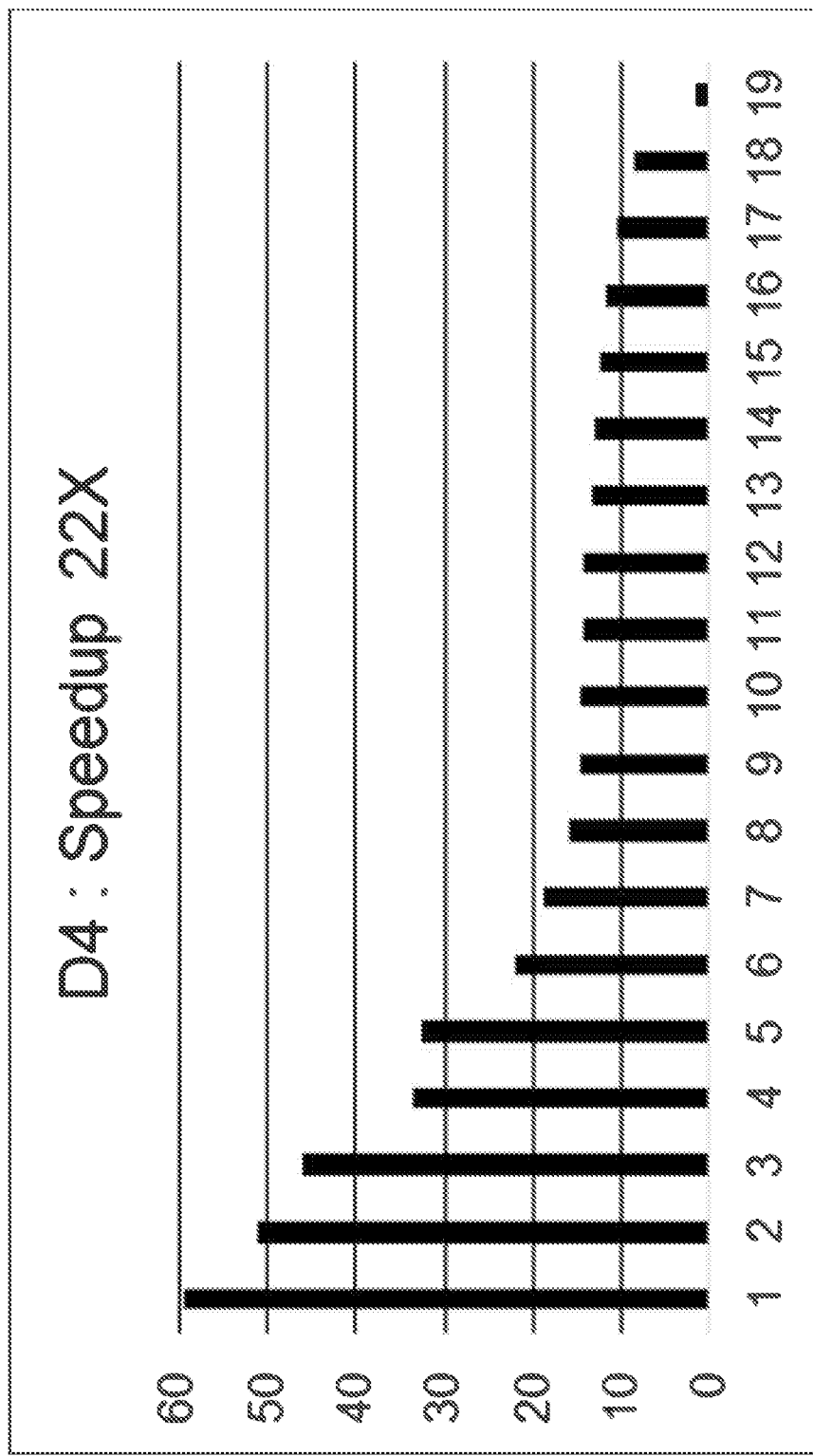
FIG. 7 shows example results from an embodiment that depicts the speedup for design D4, as described further herein.
Figure 8:
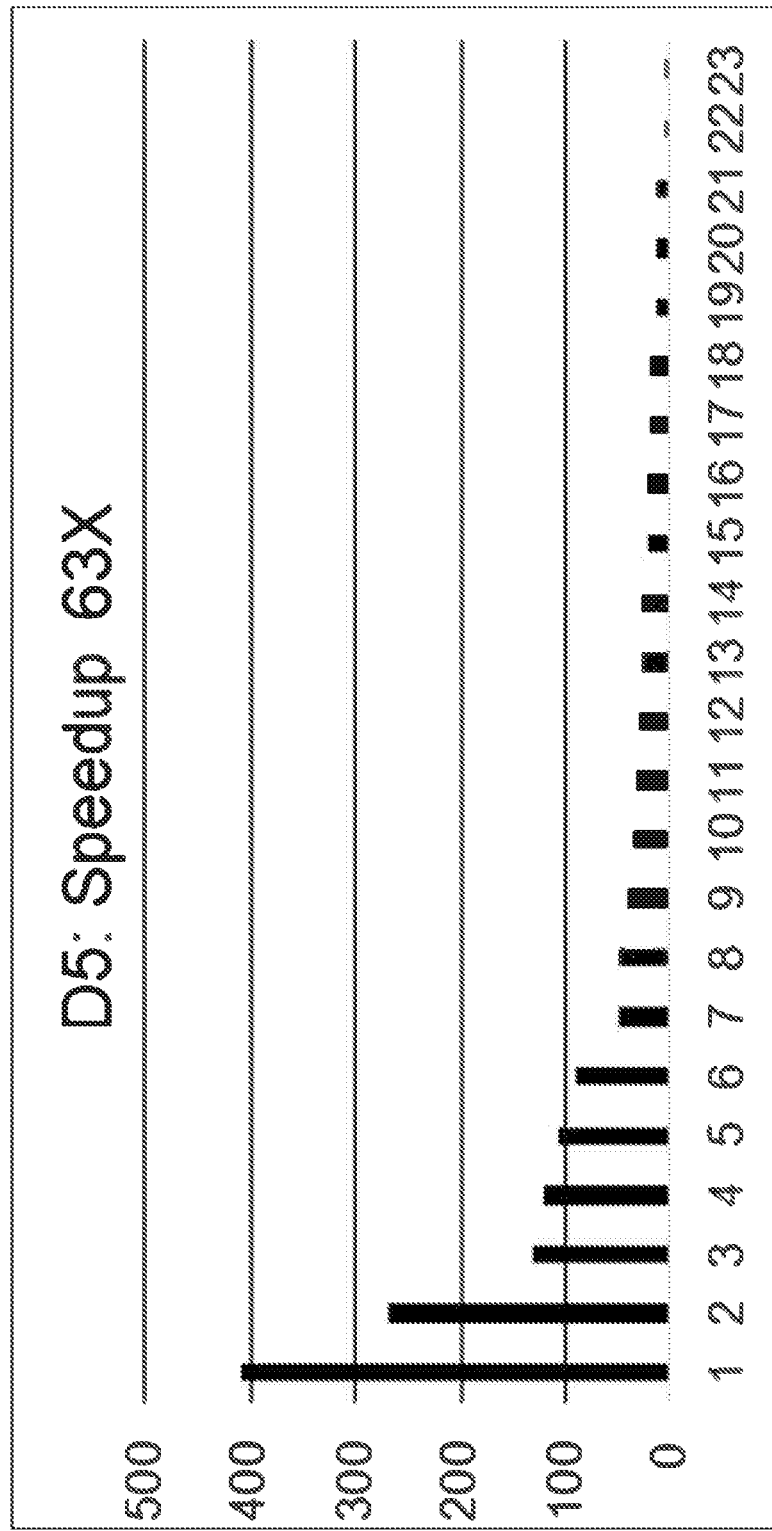
FIG. 8 shows example results from an embodiment that depicts the speedup for design D5, as described further herein.
Figure 9:
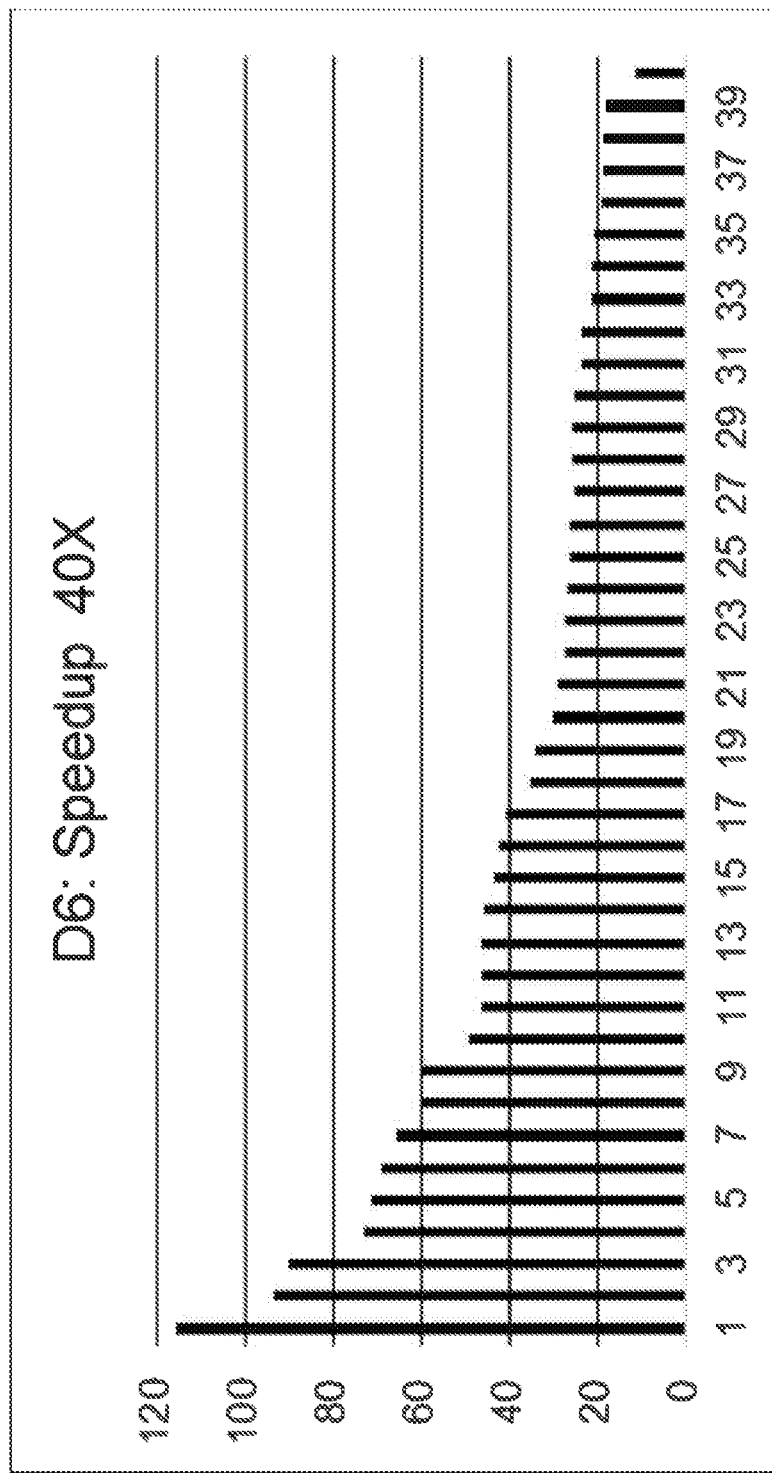
FIG. 9 shows example results from an embodiment that depicts the speedup for design D6, as described further herein.

FIGS. 7-9 each show speedups per die for designs D4, D5 and D6, respectively. The average speedup for D4, D5, and D6 is 22×, 40×, and 63×, respectively. These experiments may be used to confirm that the proposed algorithm may increase the throughput of volume diagnosis and may consistently improve the quality of diagnostic results over the baseline (multi-pass) algorithm.

FIG. 10. shows an example method 1000 for single-pass diagnosis of multiple chain defects, according to some embodiments. Method 1000 may be performed by processing logic that may comprise hardware (e.g., circuitry, dedicated logic, programmable logic, microcode, etc.), software (e.g., instructions executing on a processing device), or a combination thereof.

Method 1000 shall be described with reference to FIGS. 2-10. However, method 1000 is not limited only to those example embodiments. The steps of method 1000 may be performed by at least one computer processor coupled to at least one memory device. An example processor and memory device(s) are described below with respect to 1002 and 1004, respectively, of FIG. 13. In some embodiments, method 1000 may be performed using computer system 1300 of FIG. 13, which may further include at least one processor and memory such as those of FIG. 13.

In 1002, at least one processor 1302 may select a plurality of a scan chains in a circuit under test (CUT). The plurality of scan chains may include a first scan chain and a second scan chain, in some embodiments. The first scan chain may include a plurality of first scan cells that are connected to form the first scan chain, for example. Likewise, the second scan chain comprises a plurality of second scan cells that are connected to form the second scan chain. Other examples of scan cells, scan chains, and their selection are described or referenced in further detail elsewhere herein.

In 1004, processor 1302 may determine, in the CUT, presence of at least a first defect in the first scan chain, and at least a second defect in the first scan chain or in the second scan chain. In other words, multiple defects may be present in the CUT, whether in the same scan chain or in multiple scan chains. To the extent that a fault may occur, e.g., a test pattern, chain pattern, capture pattern, etc., or any set thereof, may fail as a result of at any of multiple defects, a first fault resulting from a first defect may affect a later-tested part of the same scan chain, or another scan chain, such that subsequent verification may be difficult or impossible if using only conventional techniques.

Thus, for purposes of 1004, according to some embodiments, where a second fault may be possible, but where actual test results may be masked due to the first fault, existence of this unknown value may also be treated as a fault, such as the second fault for example. In some embodiments, multiple faults may be detectable by observable deviations from a known fault-free state in a similar part of a good-machine simulation, although an overall simulation state, circuit output or pinout, bit vector, or element thereof, to name a few non-limiting examples, may still remain uncertain due to superposition of multiple faults. In any such cases as these described here, multiple faults may be determined in any of at least these ways. Other examples of fault detection and defect determination are described or referenced in further detail elsewhere herein.

In 1006, processor 1302 may map the first defect to a first range of first scan cells, and may map the second defect to a second range of second scan cells. In so doing, processor 1302 may effectively narrow a scope of the CUT to search for resolving multiple chain defects in a single pass. For example, by mapping ranges of scan cells to respective areas of a CUT (e.g., with respect to a design for testing) to potential areas or locations where defects may be present, processor 1302 also thereby may eliminate from consideration other parts of the CUT that are not likely or possible to cause faults or otherwise have defects present. According to some embodiments, vector-based techniques may be used for this mapping. Other examples of mapping ranges of scan cells to defects or potential defects are described or referenced in further detail elsewhere herein.

One purpose of selection is to reduce ranges as fast as possible in order to reduce unknown values. Failing capture-patterns may be simulated in multiple simulation passes (e.g., twenty patterns per simulation pass). Dynamic selection, as well as order of failing capture patterns, may thus have a significant impact on results. Dynamic selection may involve selecting a failing capture-pattern that has a highest range of potentially defective scan chains at each step of simulation. Regarding order of failing capture-patterns, if patterns were to be simulated in an opposite order from one simulation pass to another in comparable simulations, then multiple passes may be needed in order to yield the same results for otherwise equivalent simulations. "Single-pass" here may signify that each failing capture-pattern may be simulated once. However, a "single-pass" for each failing capture-pattern may still include multiple simulation passes, because not all failing capture-patterns may be simulated in a single simulation pass, in some embodiments.

For example, if a number of failing capture patterns is 300, but only up to 20 capture patterns can be simulated in each simulation pass, in one non-limiting example, then the algorithm will need at least fifteen simulation passes to simulate all failing capture-patterns. In another example, if a first simulation pass alone reduces the first ranges to 2-8 and the second range to 3-99, then a second simulation pass alone may reduce the first ranges to 2-8 and the second range to 15-58. If the second simulation pass is applied before the first simulation pass the result may be improved, because the second (wider) range includes 44 and 97 scan cells after the second simulation pass and the first simulation pass, respectively.

As a result, fewer X's may be expected after the first simulation pass than in the second simulation pass, because the second range may be narrower after the second simulation pass than the first simulation pass. As a result, a compound fault of the second range includes fewer faults after the second simulation pass than the first simulation pass. In some embodiments, the failing capture-patterns may be dynamically selected in each simulation pass, such that the failing capture-patterns that have a potential to reduce the widest range are selected for simulation before the failing capture-patterns that have a potential to reduce a narrower range. The diagnostic resolution may be further improved if a wider range is simulated before a narrower range in each simulation pass. Ranges may be determined based on ranking scores calculated after each simulation pass, for example, and as described elsewhere herein regarding dynamic selection. In some embodiments, ranking scores may be calculated based on initial mapping or updated mapping of defects to scan-cell ranges in scan chains, which may, in turn, affect subsequent dynamic selections. An efficiency of the described dynamic selection may be evaluated based on the total number of fault candidates in all ranges after each simulation pass, to name a non-limiting example. Here, dynamic selection of failing capture-patterns is considered dynamic because it may reflect the updated ranges of scan chains after each simulation pass.

In 1008, processor 1302 may locate, based at least in part on a failing capture-pattern set the first defect in a first scan cell of the first range. Similarly, processor 1302 may also locate, based at least in part on the failing capture-pattern set, the second defect in a second scan cell, which may be in the first range or the second range, according to some embodiments. Locating (localizing) defects in this way may thus allow ranges (e.g., per mapping in 1006) to be tailored to manageable sizes suitable for locating and resolving more compound defects more efficiently. Likewise, parts of a CUT likely to have few to no defects may be spared from having valuable test resources used on them (per mapping in 1006), thereby allowing improved resolution where needed to locate defects with higher precision and efficiency in 1008. Other examples of event-based test patterns mimicking specific ATE behavior are described or referenced in further detail elsewhere herein.

In 1010, processor 1302 may output a first location corresponding to the first scan cell and a second location corresponding to the second scan cell, for example. In some embodiments, if no more than three consecutive scan cells are located as defects, per 1008, the CUT may be evaluated as PFA-able, ready for more rigorous testing and formal verification. Such consecutive scan cells may be determined based on processor 1302 outputting in 1010 locations of multiple defects. Locations may be output as representations (e.g., data structures, text reports, etc.) suitable for use in an EDA application or via other tools in a pipeline of EDA tools, which may interface via various protocols, APIs, or other equivalent means. FIGS. 2-5 provide some non-limiting examples of various outputs, according to some embodiments. Other examples and further details of simulation outputs for testing of electronic circuit (e.g., CUT) structures are described in more detail and referenced elsewhere herein.

Examples of how processor 1302 may perform any operations or steps of method 1000 are described further above, such as with respect to FIGS. 1-13. Any or all of the above steps may be performed as part of embodiments as shown and described further above with respect to FIG. 1-13, in some embodiments. Additionally or alternatively, any or all of the above steps may be performed as part of processing demonstrated in FIGS. 2-10, for example.

Not all steps of process 1000 may be needed in all cases to perform the enhanced techniques disclosed herein. Further, some steps of process 1000 may be performed simultaneously, or in a different order from that shown in FIG. 10, as will be understood by a person of ordinary skill in the art.

FIG. 11 illustrates an example set of processes 1100 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1110 with information supplied by a designer, information which is transformed to create an article of manufacture that uses a set of EDA processes 1112. When the design is finalized, the design is taped-out 1134, which is when artwork (e.g., geometric patterns) for the integrated circuit is sent to a fabrication facility to manufacture the mask set, which is then used to manufacture the integrated circuit. After tape-out, a semiconductor die is fabricated 1136 and packaging and assembly processes 1138 are performed to produce the finished integrated circuit 1140.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 11. The processes described by be enabled by EDA products (or tools).

During system design 1114, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1116, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1118, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1120, the netlist is checked for compliance with timing constraints and for correspondence with the HDL code. During design planning 1122, an overall floor plan for the integrated circuit is constructed and analyzed for timing and top-level routing.

During layout or physical implementation 1124, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1126, the circuit function is verified at the layout level, which permits refinement of the layout design. During physical verification 1128, the layout design is checked to ensure that manufacturing constraints are correct, such as DRC constraints, electrical constraints, lithographic constraints, and that circuitry function matches the HDL design specification. During resolution enhancement 1130, the geometry of the layout is transformed to improve how the circuit design is manufactured.

During tape-out, data is created to be used (after lithographic enhancements are applied if appropriate) for production of lithography masks. During mask data preparation 1132, the 'tape-out' data is used to produce lithography masks that are used to produce finished integrated circuits.

A storage subsystem of a computer system (such as computer system 1300 of FIG. 13, or host system 1207 of FIG. 12) may be used to store the programs and data structures that are used by some or all of the EDA products described herein, and products used for development of cells for the library and for physical and logical design that use the library.

FIG. 12 depicts an abstract diagram of an example emulation environment 1200. An emulation environment 1200 may be configured to verify the functionality of the circuit design. The emulation environment 1200 may include a host system 1207 (e.g., a computer that is part of an EDA system) and an emulation system 1202 (e.g., a set of programmable devices such as Field Programmable Gate Arrays (FPGAs) or processors). The host system generates data and information by using a compiler 1210 to structure the emulation system to emulate a circuit design. A circuit design to be emulated may refer to a CUT and may also be referred to as a Design Under Test (TUT') where data and information from the emulation are used to verify the functionality of the CUT.

The host system 1207 may include one or more processors. In the embodiment where the host system includes multiple processors, the functions described herein as being performed by the host system can be distributed among the multiple processors. The host system 1207 may include a compiler 1210 to transform specifications written in a description language that represents a CUT and to produce data (e.g., binary data) and information that is used to structure the emulation system 1202 to emulate the CUT. The compiler 1210 can transform, change, restructure, add new functions to, and/or control the timing of the CUT.

The host system 1207 and emulation system 1202 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 1202.11. The host system 1207 and emulation system 1202 can exchange data and information through a third device such as a network server.

The emulation system 1202 includes multiple FPGAs (or other modules) such as FPGAs 1204$_1$ and 1204$_2$ as well as additional FPGAs to 1204$_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating CUTs. For example, the emulation system 1202 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs 1204$_1$-804$_N$ may be placed onto one or more boards 1212$_1$ and 1212$_2$ as well as additional boards through 1212$_M$. Multiple boards can be placed into an emulation unit 1214$_1$. The boards within an emulation unit can be connected using the backplane of the emulation unit or any other types of connections. In addition, multiple emulation units (e.g., 1214$_1$ and 1214$_2$ through 1214$_K$) can be connected to each other by cables or any other means to form a multi-emulation unit system.

For a CUT that is to be emulated, the host system 300 transmits one or more bit files to the emulation system 1202. The bit files may specify a description of the CUT and may further specify partitions of the CUT created by the host system 1207 with trace and injection logic, mappings of the partitions to the FPGAs of the emulator, and design constraints. Using the bit files, the emulator structures the FPGAs to perform the functions of the CUT. In some embodiments, one or more FPGAs of the emulators may have the trace and injection logic built into the silicon of the FPGA. In such an embodiment, the FPGAs may not be structured by the host system to emulate trace and injection logic.

The host system 1207 receives a description of a CUT that is to be emulated. In some embodiments, the CUT description is in a description language (e.g., a register transfer language (RTL)). In some embodiments, the CUT description is in netlist level files or a mix of netlist level files and HDL files. If part of the CUT description or the entire CUT description is in an HDL, then the host system can synthesize the CUT description to create a gate level netlist using the CUT description. A host system can use the netlist of the CUT to partition the CUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the CUT logic.

The host system creates bit files describing each partition of the CUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the CUT (e.g., to which FPGAs each component is mapped).

Upon request, the host system transmits the bit files to the emulator. The host system signals the emulator to start the emulation of the CUT. During emulation of the CUT or at the end of the emulation, the host system receives emulation results from the emulator through the emulation connection. Emulation results are data and information generated by the emulator during the emulation of the CUT which include interface signals and states of interface signals that have been traced by the trace and injection logic of each FPGA. The host system can store the emulation results and/or transmits the emulation results to another processing system.

After emulation of the CUT, a circuit designer can request to debug a component of the CUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the CUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 1207 and/or the compiler 1210 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a CUT 1205 into gate level logic. For a CUT that is to be emulated, the design synthesizer sub-system receives a description of the CUT. If the description of the CUT is fully or partially in HDL (e.g., RTL or other level of abstraction), the design synthesizer sub-system synthesizes the HDL of the CUT to create a gate-level netlist with a description of the CUT in terms of gate level logic.

The mapping sub-system partitions CUTs and maps the partitions into emulator FPGAs. The mapping sub-system partitions a CUT at the gate level into a number of partitions using the netlist of the CUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the CUT prior to the partitioning. For example, the trace and injection logic can be added by the design synthesizer sub-system prior to or after the synthesizing the HDL of the CUT.

In addition to including the trace and injection logic, the mapping sub-system can include additional tracing logic in a partition to trace the states of certain CUT components that are not traced by the trace and injection. The mapping sub-system can include the additional tracing logic in the CUT prior to the partitioning or in partitions after the partitioning. The design synthesizer sub-system can include the additional tracing logic in an HDL description of the CUT prior to synthesizing the HDL description.

The mapping sub-system maps each partition of the CUT to an FPGA of the emulator. For partitioning and mapping, the mapping sub-system uses design rules, design constraints (e.g., timing or logic constraints), and information about the emulator. For components of the CUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the CUT and routing information of connections between FPGAs and connections within each FPGA. The mapping sub-system can generate a bit file for each partition of the CUT and can store the bit file in the storage sub-system. Upon request from a circuit designer, the mapping sub-system transmits the bit files to the emulator, and the emulator can use the bit files to structure the FPGAs to emulate the CUT.

If the emulator includes specialized ASICs that include the trace and injection logic, the mapping sub-system can generate a specific structure that connects the specialized ASICs to the CUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the CUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug CUT components. After the emulator has emulated a CUT and the results sub-system has received the interface signals traced by the trace and injection logic during the emulation, a circuit designer can request to debug a component of the CUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of CUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the CUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

FIG. 13 illustrates an example machine of a computer system 1300 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1300 includes a processing device 1302, a main memory 1304 (e.g., read-only memory (ROM), flash memory, dynamic random access memory (DRAM) such as synchronous DRAM (SDRAM), a static memory 1306 (e.g., flash memory, static random access memory (SRAM), etc.), and a data storage device 1318, which communicate with each other via a bus 1330.

Processing device 1302 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1302 may also be one or more special-purpose processing devices such as an application specific integrated circuit (ASIC), a field programmable gate array (FPGA), a digital signal processor (DSP), network processor, or the like. The processing device 1302 may be configured to execute instructions 1326 for performing the operations and steps described herein.

The computer system 1300 may further include a network interface device 1308 to communicate over the network 1320. The computer system 1300 also may include a video display unit 1310 (e.g., a liquid crystal display (LCD) or a cathode ray tube (CRT)), an alphanumeric input device 1312 (e.g., a keyboard), a cursor control device 1314 (e.g., a mouse), a graphics processing unit 1322, a signal generation device 1316 (e.g., a speaker), graphics processing unit 1322, video processing unit 1328, and audio processing unit 1332.

The data storage device 1318 may include a machine-readable storage medium 1324 (also known as a non-transitory computer-readable medium) on which is stored one or more sets of instructions 1326 or software embodying any one or more of the methodologies or functions described herein. The instructions 1326 may also reside, completely or at least partially, within the main memory 1304 and/or within the processing device 1302 during execution thereof by the computer system 1300, the main memory 1304 and the processing device 1302 also constituting machine-readable storage media.

In some implementations, the instructions 1326 include instructions to implement functionality corresponding to the present disclosure. While the machine-readable storage medium 1324 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1302 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term 'module' signifies a tangible data and information processing device, that typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as SystemC, can be used to generate a specification for a network of digital logic devices that process data and information with exactly the same results as are obtained from the methods and procedures.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures, and like elements are labeled with like numerals. The disclosure and drawings are, accordingly, to be regarded in an illustrative sense rather than a restrictive sense.

What is claimed is:

1. A method of single-pass diagnosis in a circuit under test (CUT), the method comprising:
   selecting, by a processor, a plurality of a scan chains in the CUT, wherein:
   the plurality of scan chains comprises a first scan chain and a second scan chain,
   the first scan chain comprises a plurality of first scan cells that are connected to form the first scan chain, and
   the second scan chain comprises a plurality of second scan cells that are connected to form the second scan chain;
   determining, by the processor, presence of at least: a first defect in the first scan chain, and a second defect in the second scan chain;
   mapping, by the processor, the first defect to a first range of first scan cells, and the second defect to a second range of second scan cells;
   locating, by the processor, based at least in part on a failing capture pattern set, the first defect in a first scan cell of the first range, and the second defect in a second scan cell of the second range; and
   outputting, by the processor, a first location corresponding to the first scan cell and a second location corresponding to the second scan cell.

2. The method of claim 1, wherein the second range is narrower than the first range.

3. The method of claim 1, wherein a failing capture pattern is an element of the failing capture pattern set.

4. The method of claim 3, wherein the failing capture pattern fails after scanning in at least one uncompressed test stimulus, applying a capture clock, and scanning out at least one noncompacted faulty capture test response.

5. The method of claim 1, further comprising:
   identifying, by the processor, a first defect type corresponding to the first defect and a second defect type corresponding to the second defect.

6. The method of claim 5, wherein each of the first defect type and the second defect type comprise stuck-at-0, stuck-at-1, slow-to-rise, slow-to-fall, slow-to-rise-and-fall, fast-to-rise, fast-to-fall, fast-to-rise-and-fall, or a combination thereof.

7. The method of claim 1, further comprising:
   validating the diagnosis by injecting, by the processor, a first fault candidate within the first range;
   performing, by the processor, a simulation of the CUT; and
   calculating, by the processor, a first ranking score, of the first fault candidate,
   based at least in part on the simulation of the CUT and the injecting.

8. The method of claim 7, further comprising:
   injecting, by the processor, a second fault candidate within the second range, based at least in part on a simulation of a fault-free CUT and the injecting, wherein the second fault candidate is a compound fault by superposition of multiple fault effects in the second range corresponding to the second fault candidate;
   updating, by the processor, the simulation of the CUT, propagating any changes based on the simulation, and
   calculating, by the processor, a second ranking score, of the second fault candidate, based at least in part on the simulation of the CUT and the injecting of the second fault candidate.

9. The method of claim 8, further comprising:
   modifying, by the processor, a load value for the first fault candidate and the second fault candidate;
   updating, by the processor, the simulation of the CUT, propagating any changes based on the simulation; and
   calculating, by the processor, a new ranking score of the first fault candidate and the second fault candidate, based at least in part on the simulation of the CUT, independently of any test-compression scheme for the CUT.

10. The method of claim 9, wherein the new ranking score is part of a data structure configured to store a signature of at least the first defect or the second defect.

11. The method of claim 1, wherein the selecting, the determining, the mapping, the locating, and the outputting are performed in a single pass over the failing capture pattern set.

12. The method of claim 1, wherein the failing capture pattern set is dynamically selected in response to at least one of a ranking score, the mapping of the first range or the second range, an updated mapping, an updated ranking score, or a combination thereof.

13. The method of claim 1, further comprising:
simulating, by the processor, the second range before simulating the first range, wherein the first range is narrower than the second range.

14. A non-transitory computer-readable medium storing instructions thereon that, when executed by a processor, cause the processor to:
select a plurality of a scan chains in a circuit under test (CUT), wherein:
the plurality of scan chains comprises a first scan chain and a second scan chain,
the first scan chain comprises a plurality of first scan cells that are connected to form the first scan chain, and
the second scan chain comprises a plurality of second scan cells that are connected to form the second scan chain;
determine presence of at least:
a first defect in the first scan chain, and
a second defect in the first second scan chain;
map the first defect to a first range of first scan cells, and the second defect to a second range of second scan cells;
locate based at least in part on a failing capture pattern set, the first defect in a first scan cell of the first range, and the second defect in a second scan cell of the second range;
and
output a first location corresponding to the first scan cell and a second location corresponding to the second scan cell.

15. A system, comprising:
a memory storing instructions; and
a processor connected to the memory and to execute the instructions, the instructions when executed cause the processor to:
select a plurality of a scan chains in a circuit under test (CUT), wherein:
the plurality of scan chains comprises a first scan chain and a second scan chain,
the first scan chain comprises a plurality of first scan cells that are connected to form the first scan chain, and
the second scan chain comprises a plurality of second scan cells that are connected to form the second scan chain;
determine presence of at least:
a first defect in the first scan chain, and
a second defect in the second scan chain;
map the first defect to a first range of first scan cells, and the second defect to a second range of second scan cells;
locate based at least in part on a failing capture pattern set, the first defect in a first scan cell of the first range, and the second defect in a second scan cell of the second range;
and
output a first location corresponding to the first scan cell and a second location corresponding to the second scan cell.

16. The system of claim 15, a failing capture pattern is an element of the failing capture pattern set.

17. The system of claim 16, wherein the failing capture pattern fails after scanning in at least one uncompressed test stimulus, applying a capture clock, and scanning out at least one noncompacted faulty capture test response.

18. The system of claim 15, wherein the processor is further configured to: identify a first defect type corresponding to the first defect and a second defect type corresponding to the second defect.

19. The system of claim 18, wherein each of the first defect type and the second defect type comprise stuck-at-0, stuck-at-1, slow-to-rise, slow-to-fall, slow-to-rise-and-fall, fast-to-rise, fast-to-fall, fast-to-rise-and-fall, or a combination thereof.

20. The system of claim 15, wherein the processor is further configured to:
validate the first location by injecting a first fault candidate within the first range;
perform a simulation of the CUT; and
calculate a first ranking score, of the first fault candidate, based at least in part on the simulation of the CUT and the injecting.

* * * * *